United States Patent
Rupp et al.

(10) Patent No.: US 9,634,108 B2
(45) Date of Patent: Apr. 25, 2017

(54) METHOD OF MANUFACTURING A DEVICE BY LOCALLY HEATING ONE OR MORE METALIZATION LAYERS AND BY MEANS OF SELECTIVE ETCHING

(71) Applicant: Infineon Technologies AG, Neubiberg (DE)

(72) Inventors: Roland Rupp, Lauf (DE); Stefan Woehlert, Villach (AT); Thomas Gutt, Hohenbrunn (DE); Michael Treu, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/017,252

(22) Filed: Feb. 5, 2016

(65) Prior Publication Data
US 2016/0155861 A1 Jun. 2, 2016

Related U.S. Application Data

(60) Continuation of application No. 14/934,877, filed on Nov. 6, 2015, now Pat. No. 9,391,154, which is a
(Continued)

(51) Int. Cl.
*H01L 29/66* (2006.01)
*H01L 21/04* (2006.01)
(Continued)

(52) U.S. Cl.
CPC .......... *H01L 29/47* (2013.01); *H01L 21/0485* (2013.01); *H01L 21/0495* (2013.01);
(Continued)

(58) Field of Classification Search
CPC ......... H01L 2924/0002; H01L 2924/00; H01L 29/1608; H01L 29/8083; H01L 29/872;
(Continued)

(56) References Cited

U.S. PATENT DOCUMENTS 5,011,565 A * 4/1991 Dube .............. H01L 31/022425
136/256
6,110,813 A 8/2000 Ota et al.
(Continued)

FOREIGN PATENT DOCUMENTS

DE 19839969 A1 3/2000
DE 102006050360 A1 5/2008
(Continued)

OTHER PUBLICATIONS

Ota. Y., et al., Laser Alloying for Ohmic Contacts on SiC at Room Temperature, Materials Science Forum, Feb. 1998, pp. 783-786, vols. 264-268, Trans Tech Publications, Switzerland, www.scientific.net.
(Continued)

*Primary Examiner* — David Vu
*Assistant Examiner* — Jonathan Han
(74) *Attorney, Agent, or Firm* — Maginot, Moore & Beck LLP

(57) ABSTRACT

A method of manufacturing a device comprises depositing one or more metallization layers to a substrate, locally heating an area of the one or more metallization layers to obtain a substrate/metallization-layer compound or a metallization-layer compound, the compound comprising an etch-selectivity toward an etching medium which is different to that of the one or more metallization layers outside the area, and removing the one or more metallization layers in the area or outside the area, depending on the etching selectivity in the area or outside the area, by etching with the etching medium to form the device.

12 Claims, 15 Drawing Sheets

Related U.S. Application Data division of application No. 11/789,045, filed on Apr. 23, 2007, now Pat. No. 9,209,281.

(51) Int. Cl.

| | | |
|---|---|---|
| *H01L 29/47* | (2006.01) | |
| *H01L 21/3213* | (2006.01) | |
| *H01L 21/268* | (2006.01) | |
| *H01L 29/872* | (2006.01) | |
| *H01L 23/528* | (2006.01) | |
| *H01L 29/417* | (2006.01) | |
| *H01L 29/423* | (2006.01) | |
| *H01L 29/808* | (2006.01) | |
| *H01L 29/16* | (2006.01) | |

(52) U.S. Cl.
CPC ...... *H01L 21/268* (2013.01); *H01L 21/32134* (2013.01); *H01L 23/528* (2013.01); *H01L 29/417* (2013.01); *H01L 29/41725* (2013.01); *H01L 29/42316* (2013.01); *H01L 29/6606* (2013.01); *H01L 29/66068* (2013.01); *H01L 29/66901* (2013.01); *H01L 29/66909* (2013.01); *H01L 29/808* (2013.01); *H01L 29/872* (2013.01); *H01L 29/1608* (2013.01); *H01L 2924/0002* (2013.01)

(58) Field of Classification Search
CPC   H01L 21/0485; H01L 29/7813; H01L 29/808
USPC .... 257/E21.697, E21.542, E21.403, E21.45, 257/E29.013, E29.314, 210–211, 503, 257/508, E33.062–E33.066, 257/E31.124–E31.126, E51.019; 438/92, 438/167–185, 534, 570–583
See application file for complete search history.

(56) References Cited

U.S. PATENT DOCUMENTS

| | | | |
|---|---|---|---|
| 6,261,938 B1 | 7/2001 | Beauvais et al. | |
| 6,387,786 B1 | 5/2002 | Erhardt et al. | |
| 6,468,890 B2 | 10/2002 | Bartsch et al. | |
| 6,759,683 B1* | 7/2004 | Cole | H01L 21/0485 257/198 |
| 7,038,260 B1* | 5/2006 | Yu | H01L 29/66848 257/287 |
| 7,456,443 B2* | 11/2008 | Saxler | H01L 21/318 257/194 |
| 2005/0104072 A1* | 5/2005 | Slater | H01L 21/0485 257/77 |
| 2006/0281279 A1* | 12/2006 | Beach | H01L 21/76 438/405 |
| 2008/0099769 A1 | 5/2008 | Rupp | |

FOREIGN PATENT DOCUMENTS

| | | |
|---|---|---|
| EP | 1246252 A2 | 10/2002 |
| WO | 0122498 A1 | 3/2001 |
| WO | 2005020308 A1 | 3/2005 |

OTHER PUBLICATIONS

Treu, M. et al., A Surge Current Stable and Avalanche Rugged SiC Merged pn Schottky Diode Blocking 600V Especially Suited for PFC Applications, Proceedings of the ICSCRM2003, Material Science Forum, vol. 457-460.

Zverev, I., et al., Silicon Carbide Schottky: Novel Devices Require Novel Design Rules, PCIM 2002 Proceeding, Nuremberg, Germany, May 2002.

Peters, D., et al., Comparison of 4H SiC pn, Pinch and Schottky Diodes for the 3 kV Range, Proceedings of the ICSCRM2001, Material Science Forum, vol. 389-393, 2002.

\* cited by examiner (lateral JFET)

(vertical JFET)

Al-Ni Crystal Structure Data

| Phase | Pearson Symbol | Struktur Bericht | Prototype | Model |
|---|---|---|---|---|
| fcc | cF4 | A1 | Cu | RK |
| $Al_3Ni$ | cP16 | $DO_{11}$ | $CFc_3$ | CE |
| $Al_3Ni_2$ | hP5 | $D5_{13}$ | $Al_3Ni_2$ | CE |
| AlNi | cP2 | B2 | CuCl | CE |
| $AlNi_3$ | cP4 | $L1_2$ | $AuCu_3$ | CE |

METHOD OF MANUFACTURING A DEVICE BY LOCALLY HEATING ONE OR MORE METALIZATION LAYERS AND BY MEANS OF SELECTIVE ETCHING

The present application is a continuation application of U.S. application Ser. No. 14/934,877, filed Nov. 6, 2015, which is a divisional application of U.S. application Ser. No. 11/789,045, filed Apr. 23, 2007, which is now U.S. Pat. No. 9,209,281, which is incorporated herein by reference.

FIELD OF THE INVENTION

The present invention relates to a method of manufacturing a device by locally heating one or more metallization layers and by means of selective etching, and to a device manufactured by same.

BACKGROUND OF THE INVENTION

By means of metallization, contacts to semiconductor devices are created. In this respect, the metallizations must meet a number of preconditions in order to be able to be employed in semiconductor technology. In addition to good adhesion to the respective semiconductor layer, such as silicon (Si) or silicon carbide (SiC), a high level of current-carrying capacity, low electric resistance, low contact resistance between the metallization and the semiconductor, as well as ease of patternability of the metallization are also desirable.

For manufacturing patterned metal contacts, e.g. on SiC devices, so-called lift-off technique may be employed. It involves initially applying a suitably patterned resist mask to the SiC device and subsequently applying the desired metallization layer. In a subsequent step, the resist mask is removed along with the metallization located thereon. Thus, a patterned metal contact is formed on the SiC device, comprising the image of the negative resist mask. The production of thick metal layers of thicknesses of, for example, more than 200 nm, may be critical or impossible in this context, since thick oxides and resist masks are required, and/or since irregular breakage edges would result. In addition, the risk of contamination of the semiconductor surface by metal particles or by the wet-chemical process of removing the resist mask along with the metallization layer is very high. In particular with surface-sensitive devices such as Schottky diodes, this may lead to high yield losses in production. For the metal deposition before the lift-off process, only a method with an anisotropic deposition characteristic should be employed, since otherwise an edge covering of the resist mask, or lift-off mask, will occur.

Another possibility of applying patterned metal contacts onto semiconductor devices is given by masked etching techniques, such as wet-chemical etching or plasma etching. However, this may also give rise to problems. For example, wet-chemical etching may cause undesired local underetching because of adhesion problems of the photoresist mask. The metal edge may be formed in an irregular manner, and small patterns may no longer be realized in a reliable manner. In plasma etching, an etch stop, i.e. a high etching selectivity, of the metal to the SiC or auxiliary layers such as oxides can hardly be realized. In addition, the exposed semiconductor surface may be damaged by the plasma etching process.

Therefore, what would be desirable is an alternative method for achieving a locally patterned metallization for manufacturing, for example, a SiC device without having to accept the above-mentioned disadvantages.

SUMMARY OF THE INVENTION

In accordance with at least some embodiments, the present invention provides a method of manufacturing a device by depositing one or several metallization layers to a substrate, locally heating an area of the one or several metallization layers to obtain a substrate/metallization-layer compound or a metallization-layer compound, the compound comprising an etch-selectivity toward an etching medium which is different to that of the one or several metallization layers outside the area, and by removing the one or several metallization layers in the area or outside the area, depending on the etching selectivity in the area or outside the area, by etching with the etching medium to obtain the device.

BRIEF DESCRIPTION OF THE DRAWINGS

Embodiments of the present invention will be explained below in more detail with reference to the accompanying figures, in which.

DETAILED DESCRIPTION OF EMBODIMENTS

With reference to the accompanying FIGS. 1-17, embodiments relating to the method of manufacturing a device by locally heating one or several metallization layers and by means of selective etching will be depicted in detail below.

Figure 1:
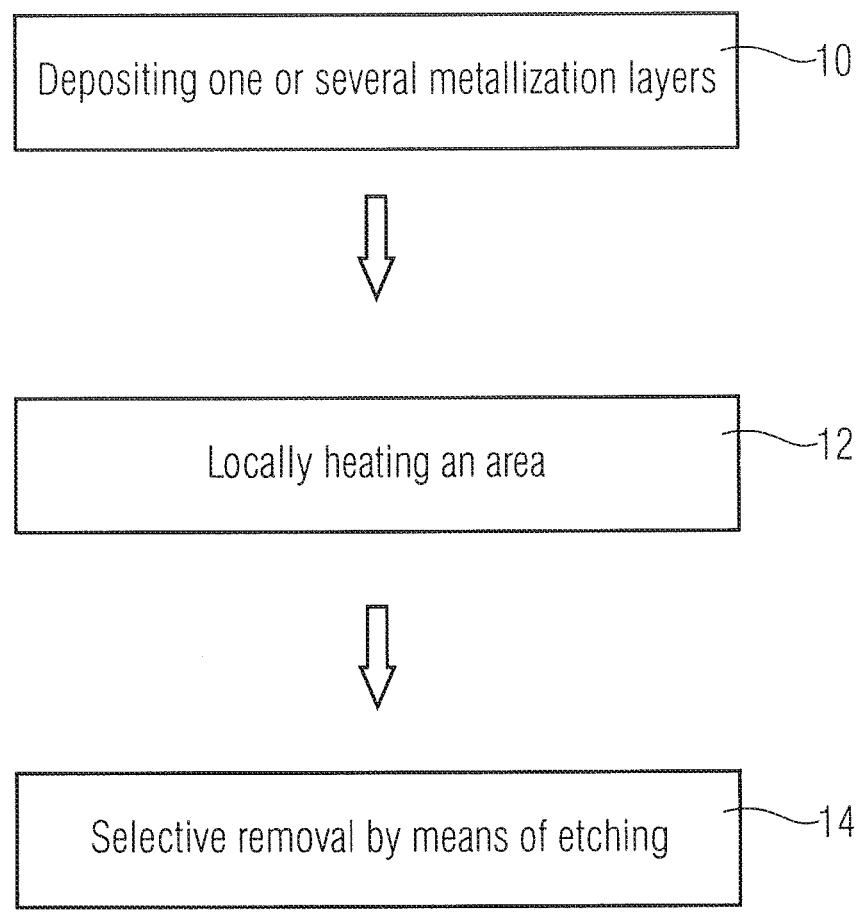
FIG. 1 is a flowchart of a method of manufacturing a device by locally heating one or several metallization layers and by means of selective etching.

With reference to FIG. 1, a detailed explanation will be given, in a flowchart, of the method of manufacturing a device. The method of manufacturing a device by locally heating one or several metallization layers and by means of selective etching comprises depositing 10 one or several metallization layers to a substrate, locally heating 12 an area of the one or several metallization layers to obtain a substrate/metallization-layer compound or a compound of the several metallization layers, the compound comprising an etch-selectivity toward an etching medium which is different to that of the one or several metallization layers outside the area, and removing 14 the one or several metallization layers in the area or outside the area, depending on the etching selectivity in the area or outside the area, by etching with the etching medium to obtain the device.

Deposition 10 of one or several metallization layers to a substrate may comprise, for example, depositing a multi-layered metal system onto the whole area of a wafer which may possibly be pre-processed and comprises, for example, SiC or Si. Deposition 10 may comprise, for example, evaporating or sputtering a Ni/Al metallization layer system onto the entire area. In this context, the layer composition may be selected such that, with suitable heating, for example, an intermetallic AlNi$_3$ phase will be formed and a minor aluminum excess may remain. The overall layer thickness of the multilayered metallization system may be, e.g., 20-200 nm in this case. Vapor deposition or sputtering may also be conducted from a mixed target comprising the respective metallization constituents.

It is also possible to directly apply a single metallization layer, for example consisting of nickel or titanium, to a silicon substrate without using a mask. The nickel and titanium silicides forming in the event of suitable heating may be resistant to certain etching media which may etch the pure metals. The metallization layer may also be configured as a ternary stack of Ni/Al/Si or of a ternary mixture of a mixed target, so that a mixed crystal having the form of $Al_{(1-x)}NiSi_{(x)}$ may form after local heating.

Locally heating 12 an area of the one or several metallization layers may be effected, for example, using a high-energy laser pulse. Locally irradiating the metallized surface may give rise to an intermetallic reaction and/or the formation of an alloy in the irradiated area within the metallization layers or between the metallization layers and the substrate.

When applying a single metallization layer, a reaction may result between the metallization layer and the substrate.

Thus, by adapting the laser pulse duration and the laser power, even metallization layers which are comparatively thick may be made to react. At the same time, a reaction or alloying into the semiconductor substrate within the area of the locally irradiated areas may be enabled so as to locally manufacture ohmic contacts without further annealing steps. Thus, the patterning of relatively thick metal layers may be enabled with this method without any risk of underetching, the so-called "crown-cork" effect, which may occur in the event of poor resist adhesion, and without damaging the surface of the semiconductor substrate.

The compounds created by locally heating 12 an area may exhibit a different etching selectivity toward an etching medium than that or those of the one or several metallization layers outside the area. This is why the removal 14 of the one or several metallization layers may be conducted in the area of local heating or outside the area, depending on the etching selectivity in the area or outside the area, by etching with the etching medium. For example, a nickel/silicide compound which may be manufactured by applying a nickel metallization layer to a silicon wafer and by means of subsequent irradiation with laser pulses of a suitable energy, will have a roughly 2000 fold etching selectivity in an $NH_4OH/H_2O_2/H_2O$ acid toward nickel. Thus, nickel may be etched 2,000 times more quickly than the nickel silicide. The same is also true for $TiSi_2$ toward Ti in $NHCl/H_2O_2$. By depositing a metallization stack of Ni and Al, local heating may form NiAl, for example, which is not etchable in hydrofluoric acid or in an $HF/HNO_3$ mixture, whereas pure Ni and Al may be readily etched in these etching solutions. Thus, in these examples, non-irradiated areas may readily be removed by respective etching media. What is also feasible, however, is the other case wherein the irradiated areas may be more readily removed by appropriate etching media. Forming the patterned contacts for the semiconductor device may thus be performed by selectively etching the one or several metallization layers without further mask layers, e.g. made of photoresist or oxides.

Figure 2:
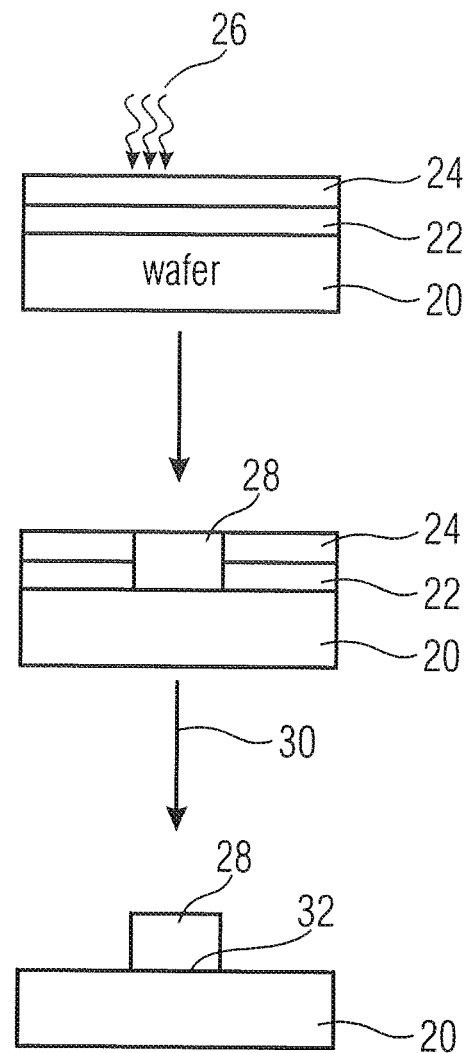
FIG. 2 is a schematized representation for forming a semi-conductor device with a structured metal contact.

FIG. 2 shows a schematic representation of the method of manufacturing a device by locally heating one or several metallization layers and by means of selective etching, in accordance with an embodiment of the present invention.

Two metal layers 22 and 24, which may be nickel and aluminum, for example, are applied to a wafer 20 comprising, e.g., Si or SiC. These metallization layers are locally irradiated 26 using a laser of a suitable pulse duration and power. The local irradiation and the associated local heating may give rise to the formation of an intermetallic reaction and/or to the formation of an alloy between the metallization layers 22 and 24 or to a formation of a substrate/metallization-layer compound between the metallization layers 24, 22 and the wafer surface 20. The compound 28 forming in the process may have a different etching selectivity toward an etching medium than that of metallization layers 22, 24 or even of wafer 20. In the event of applying an Ni/Al metallization 22, 24, an intermetallic AlNi$_3$ phase may thus be formed, for example.

The irradiated and non-irradiated areas may exhibit a differing chemical behavior toward etching media. By means of subsequent selective etching 30 using suitable etching media, the metal covering of the surface of the semiconductor substrate is retained only in the area of the compound 28. In this context, an ohmic contact 32 may form, for example, between wafer 20 and locally irradiated zone 28. Wet-chemical etching using a suitable etching solution may involve a sequence of different etching solutions and may be performed such that there is a high etching selectivity between the non-reacted and the reacted areas of the metallization layers. When using Ni and Al as the metallization layers 22 and 24, a nickel/aluminum alloy may be formed in area 28, for example by means of the irradiation using a laser of a suitable laser power. This nickel/aluminum alloy is not etchable, for example, in HF or in a mixture of $HF/HNO_3$, whereas pure nickel and aluminum may readily be etched in these etching solutions. To finally manufacture the device, further process steps, such as depositing an insulation oxide layer, passivation, or other process steps may be performed after removing the reacted areas by selective etching.

Figure 3:
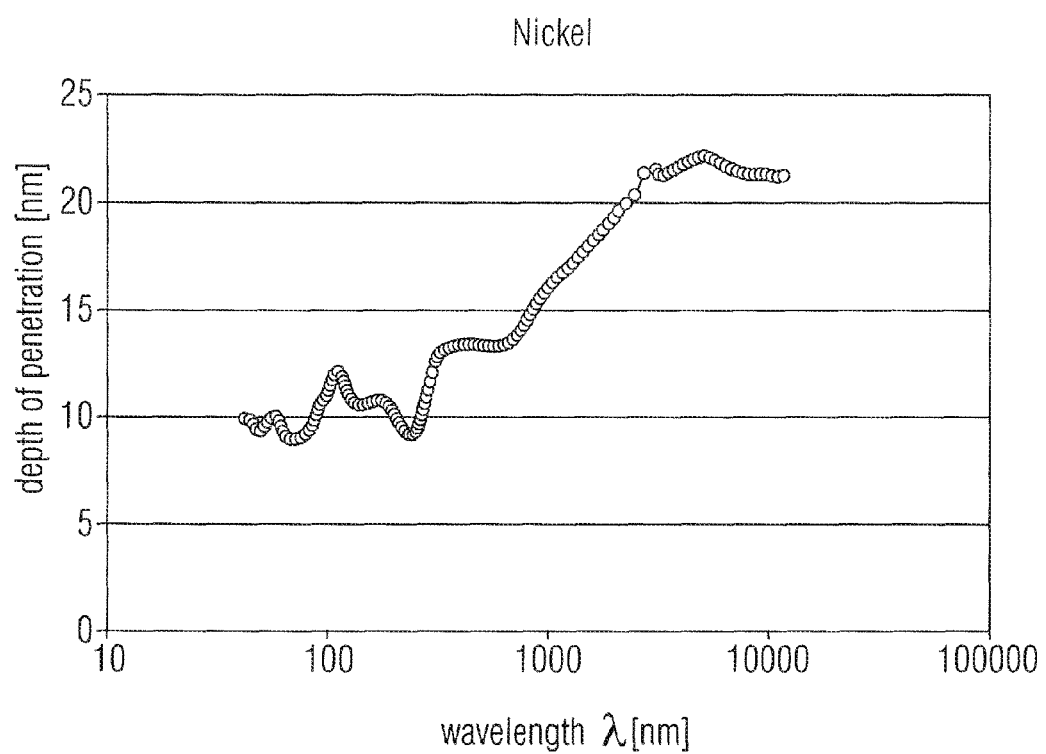
FIG. 3 is a diagram for a wavelength-dependent penetration depth of electromagnetic radiation in nickel.

FIG. 3 depicts a diagram which represents the wavelength-dependent penetration depth of electromagnetic radiation in nickel.

To locally heat up an area of the one or several metallization layers by means of electromagnetic radiation, a laser pulse of a suitable pulse duration and power may be selected, for example. By means of adapting the laser pulse duration and the laser power, even comparatively thick metal layers may be made to react. To this end, the respective laser wavelength and its penetration depth into the one or several metallization layers, and the heating required for forming the intermetallic reaction and/or for forming the alloy between the one or the several metallization layers may be adjusted to each other.

Alternatively, one can apply a series of laser pulses having two or more pulses instead of a single laser pulse of a suitable pulse duration. By controlling the durations of the pulses in the series of pulses and/or time distances between pulses in the series of pulses, one can adjust certain heat distribution characteristics and, therefore, certain structure details.

Figure 4:
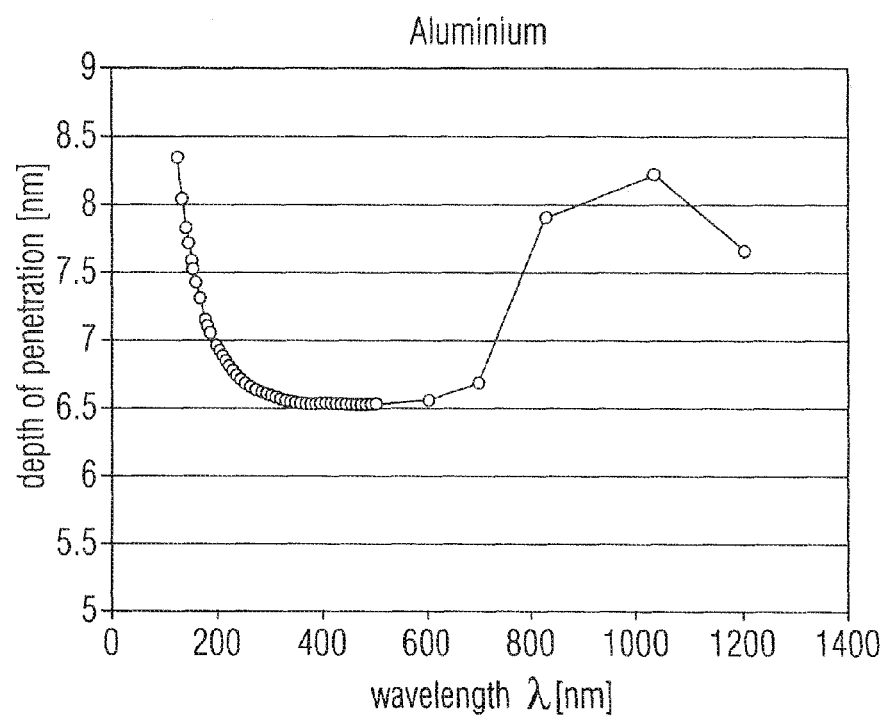
FIG. 4 is a diagram for a wavelength-dependent penetration depth of electromagnetic radiation in aluminum.

FIG. 4 depicts the wavelength-dependent penetration depth of electromagnetic radiation in aluminum. As a comparison with FIG. 3 shows, the penetration depth also depends, among other things, on the metal used.

Figure 5:
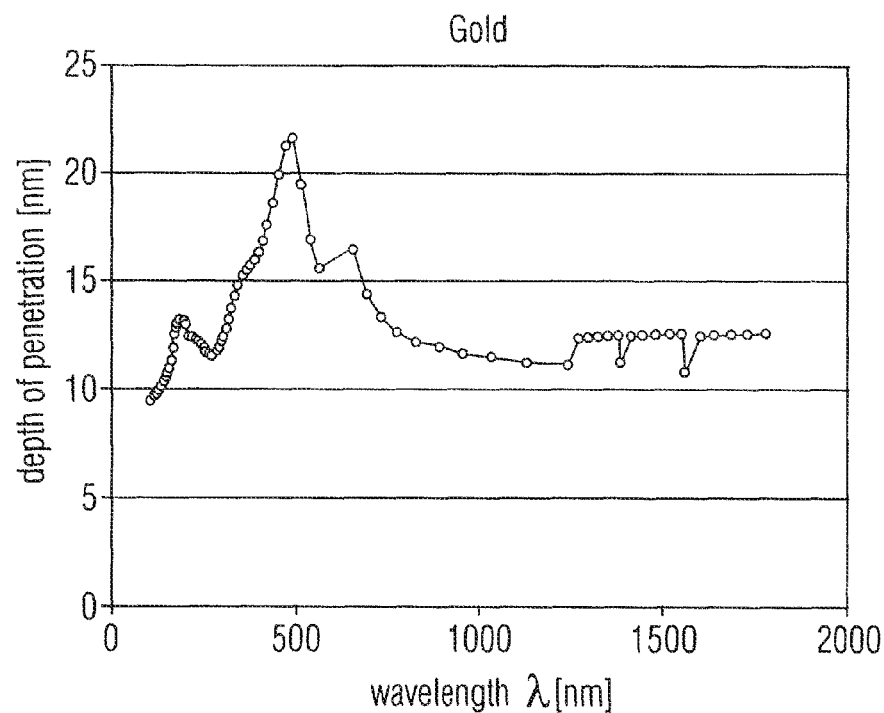
FIG. 5 is a diagram for a wavelength-dependent penetration depth of electromagnetic radiation in gold.

FIG. 5 shows the wavelength-dependent penetration depth of electromagnetic radiation in gold. For locally heating the one or several metallization layers, for example by using a laser pulse, a broad spectrum of parameters can be changed. In addition to the laser wavelength, which may be freely selected within a range of commercial lasers, the pulse duration and the laser power may also be selected.

Figure 6:
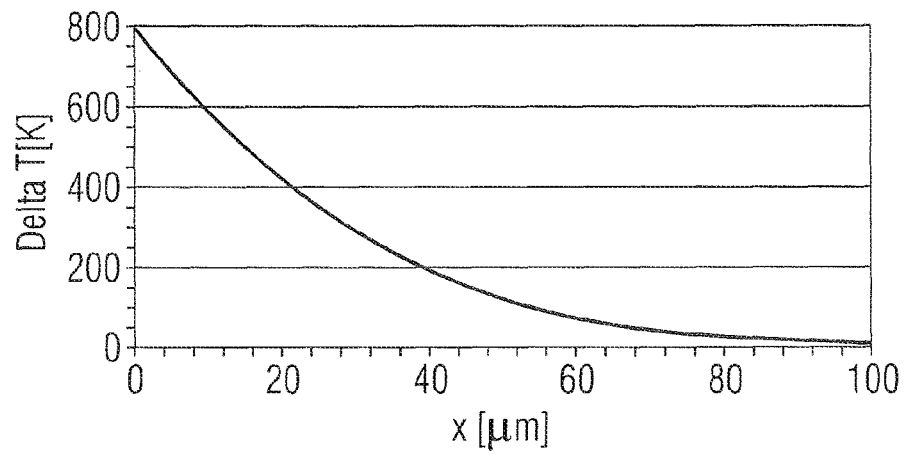
FIG. 6 is a temperature-depth profile for an absorbed laser power of 350 KW/cm$^2$ at a pulse duration of 10 μs.

The diagram in FIG. 6 depicts the layer thickness-dependent temperature profile of a metal layer after the absorption of a laser power of 350 KW/cm$^2$ at a laser pulse duration of 10 μs. The temperature difference at the surface amounts to more than 700 K and then decreases, for example, to 400 K at a layer thickness of 20 μm.

Figure 7:
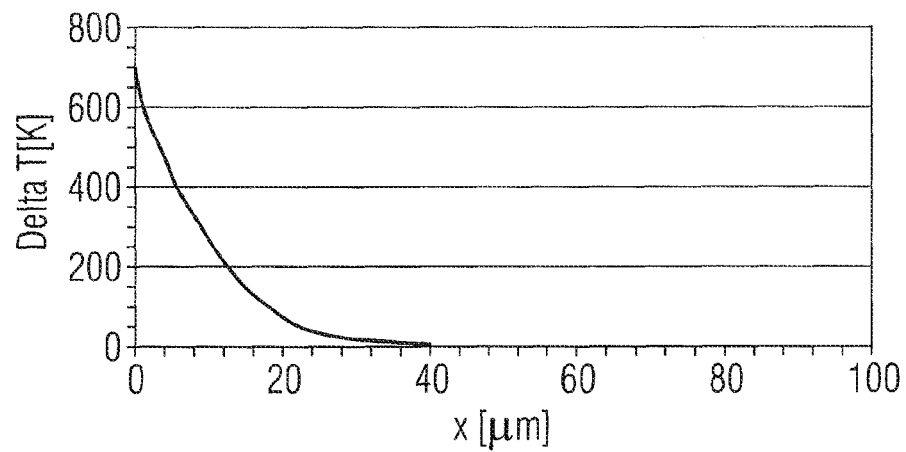
FIG. 7 is a temperature-depth profile for an absorbed laser power of 1 MW/cm$^2$ at a pulse duration of 1 μs.

FIG. 7 also shows the layer thickness-dependent temperature profile as a function of the heated-up layer thickness after the absorption of a laser power of 1 MW/cm$^2$ at a pulse duration of 1 μs. As compared to FIG. 6, the temperature in the metal layer again reaches approximately the initial temperature already at a depth of 20 μm.

Figure 8:
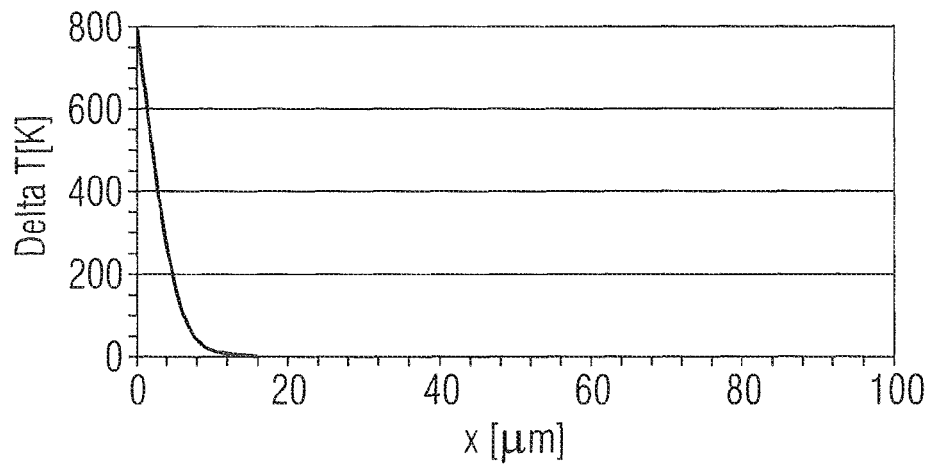
FIG. 8 is a temperature-depth profile for an absorbed laser power of 3.5 MW/cm$^2$ at a pulse duration of 100 ns.

FIG. 8 depicts the temperature as a function of the layer thickness of the irradiated metal at an absorbed laser power of 3.5 MW/cm$^2$ at a pulse duration of 100 ns. In this example, no more heating can be detected already at a layer thickness of 20 μm.

Figure 9:
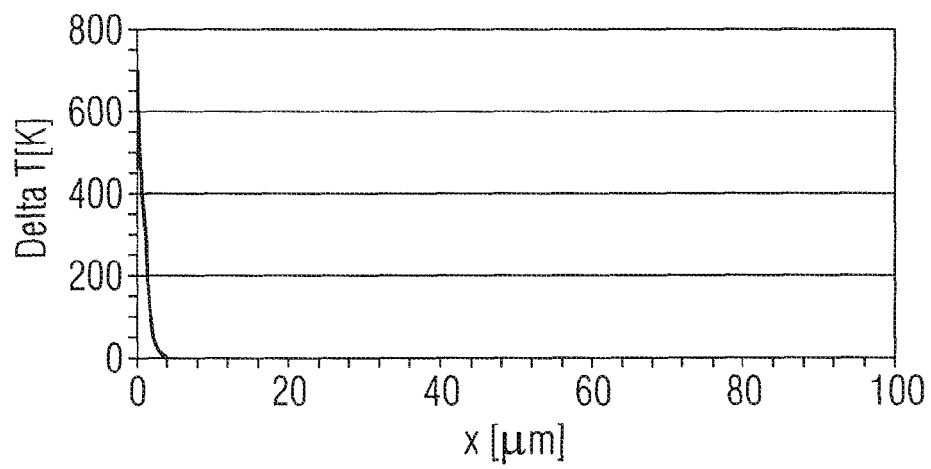
FIG. 9 is a temperature-depth profile for an absorbed laser power of 10 MW/cm$^2$ at a pulse duration of 10 ns.

FIG. 9 shows the layer thickness-dependent temperature profile at an absorbed laser power of 10 MW/cm$^2$ at a pulse duration of 10 ns. As may be seen from FIGS. 6-9, the temperature-depth profile in a metal layer may be adjusted in a targeted manner by means of the laser pulse duration and the laser power. Depending on the thickness of the one or several metallization layers to be heated up to a specific temperature for forming an intermetallic reaction and/or alloy, the pulse duration of the laser which is employed for locally heating an area may be selected accordingly. Typically, pulse durations ranging from 1 ns to 100 μs, or from 10 ns to 10 μs may be selected, for example. If an area of the one or several metallization layers is locally heated in such a manner that the substrate is also included, the temperature should be selected such that the respective reaction with the substrate surface may be enabled. For example, it may be necessary, when using SiC as the substrate, to achieve a surface temperature of more than 950° C., so that the SiC surface may react with the one or several metallization layers.

Figure 10:
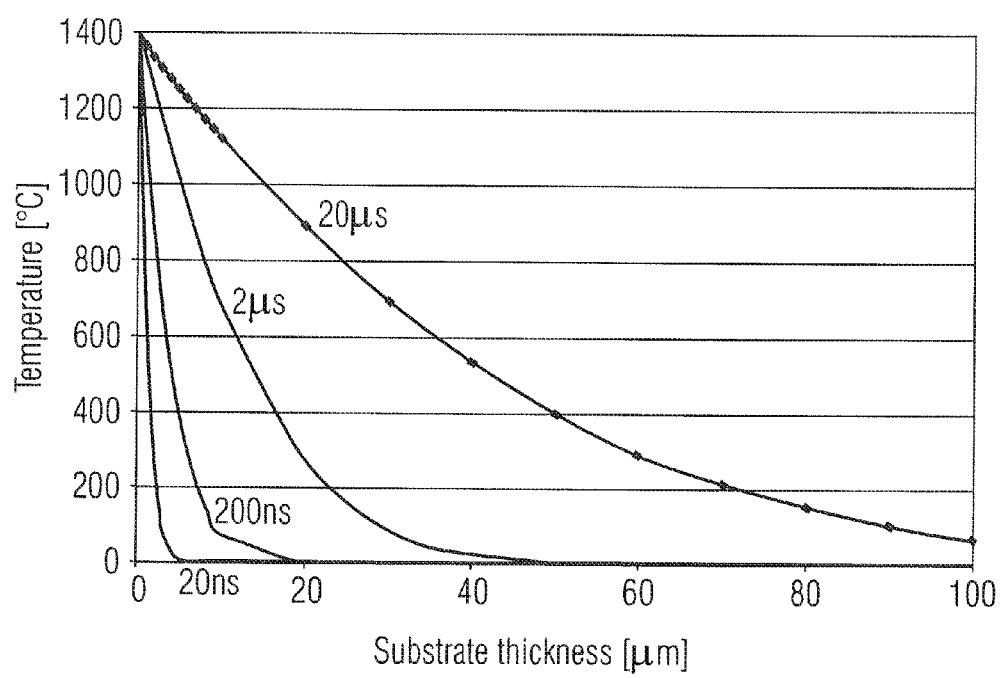
FIG. 10 is a diagram of a simulation with the temperature-depth profiles for laser pulses of different pulse durations.

The diagram in FIG. 10 shows the simulation of a one-dimensional heat flux diffusion model, wherein the temperature-depth profile is shown for different laser pulse durations. By the laser pulse duration, which was varied between 20 ns and 20 μs in the simulation, a defined temperature may be created in a certain substrate thickness in a simple manner. Thus, the laser power and the pulse duration may be selected to match the device and the metal contact to be patterned.

Figure 11:
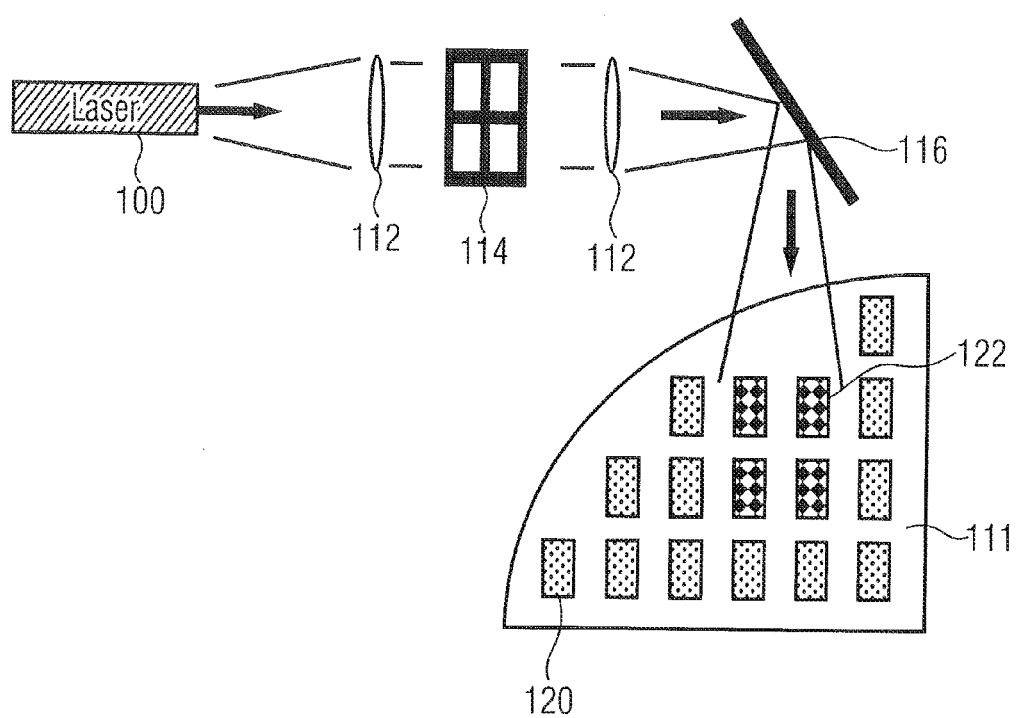
FIG. 11 is a schematic representation of irradiating local areas of a wafer with laser pulses using a mask and a mirror.

FIG. 11 schematically shows irradiation of selected areas on a wafer for locally heating a defined area with a laser 100 and a mask or a reticle 114. A suitable laser pulse of a laser 100 may be directed onto a wafer 118 with its preprocessed devices 120 which are coated with one or several metallizations, for example via lenses 112 and a mask or a reticle 114 and a respective beam-deflecting unit 116, for example a mirror, such that the areas 122 on the metallization which are defined by the mask or the reticle are locally heated up such that the etch-selective intermetallic compound or alloy may form. Thus, by means of the mask or the reticle, the one or several metallization layers may be heated up, by means of local direct exposure, such that an intermetallic reaction or alloy formation results within the metallization layers.

Figure 12:
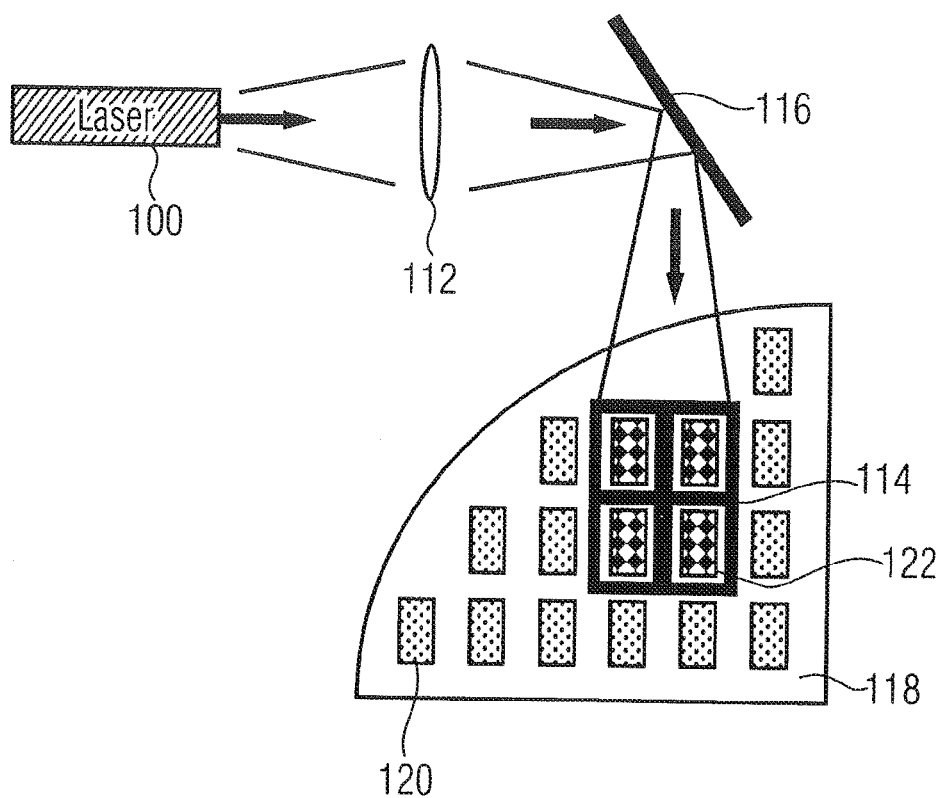
FIG. 12 is a schematic representation of irradiating local areas of a wafer with laser pulses using a mask which is located above the wafer or on the wafer.

As compared to FIG. 11, in FIG. 12, the mask 114 or the reticle which defines the areas 122, which are to be locally irradiated, on the wafer 118 with its pre-processed devices 120, is located directly on or above the wafer. In these embodiments, for example, a laser pulse of a suitable pulse duration may be directed from a laser 100 through a lens 112 and a deflection system 116 onto the areas defined by the mask 114 or the reticle so as to locally heat same up.

This configuration is useful in that a controlled or at least accelerated heat dissipation in areas covered by the mask 114 is reached, when the mask has a higher heat conductivity than the material, on which the mask is located. Thus, the heat absorbed by the mask is quickly transported away without affecting the underlying material. This results in finer structural details compared to a configuration, in which the mask is not located directly on the underlying material such as the wafer. Hence, the mask efficiently avoids heating of the metal below the mask and adjacent to the mask apertures, since the mask directly contacts the underlying metal layer on the substrate such as the semiconductor wafer.

Even when the mask has the same heat conductivity or a lower heat conductivity than the underlying metal layer, the lateral temperature gradient is nevertheless increased due to the fact that the mask has a certain heat absorbing capacity. This can be compared to the parallel connection of two resistors, in which the effective resistance of both parallely connected resistors is lowered even when the resistance of the additional resistor, which would correspond to the mask, is higher than the already existing resistor. Hence, smaller structural details can be manufactured, when the mask is directly contacting the underlying substrate, which may comprise one or more metal layers on a semiconductor substrate.

Figure 13A:
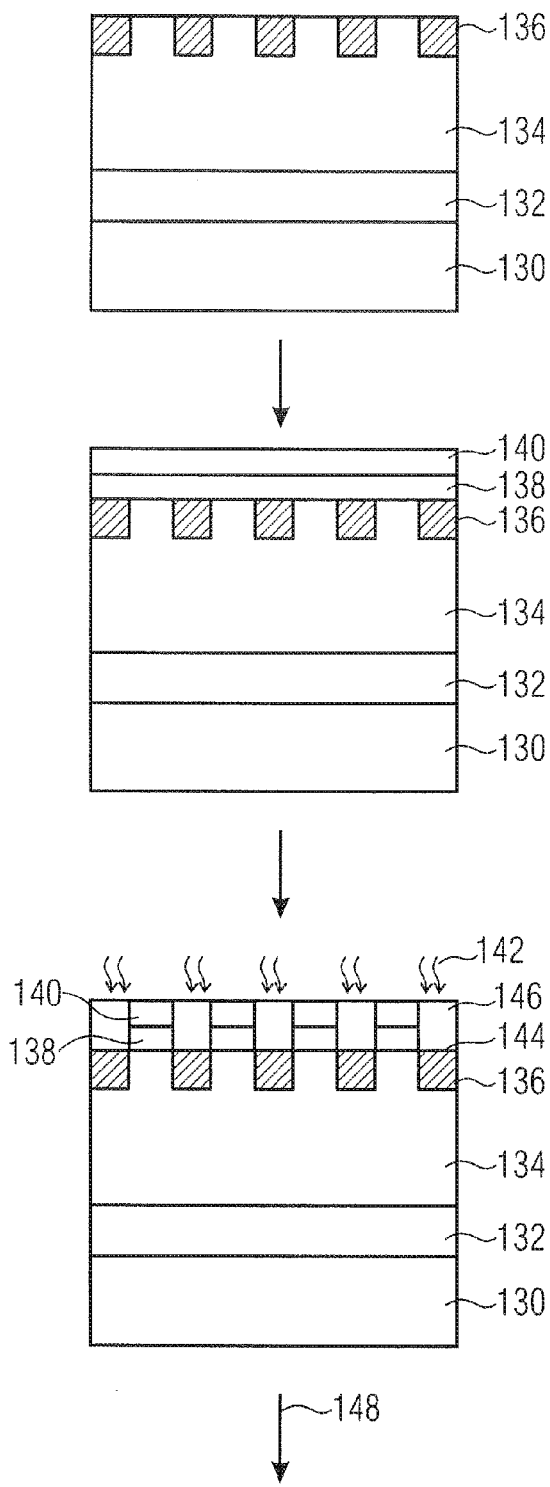
FIG. 13*a* is a first sequence of schematized cross-sections of an SiC diode during the inventive manufacturing method.
Figure 13B:
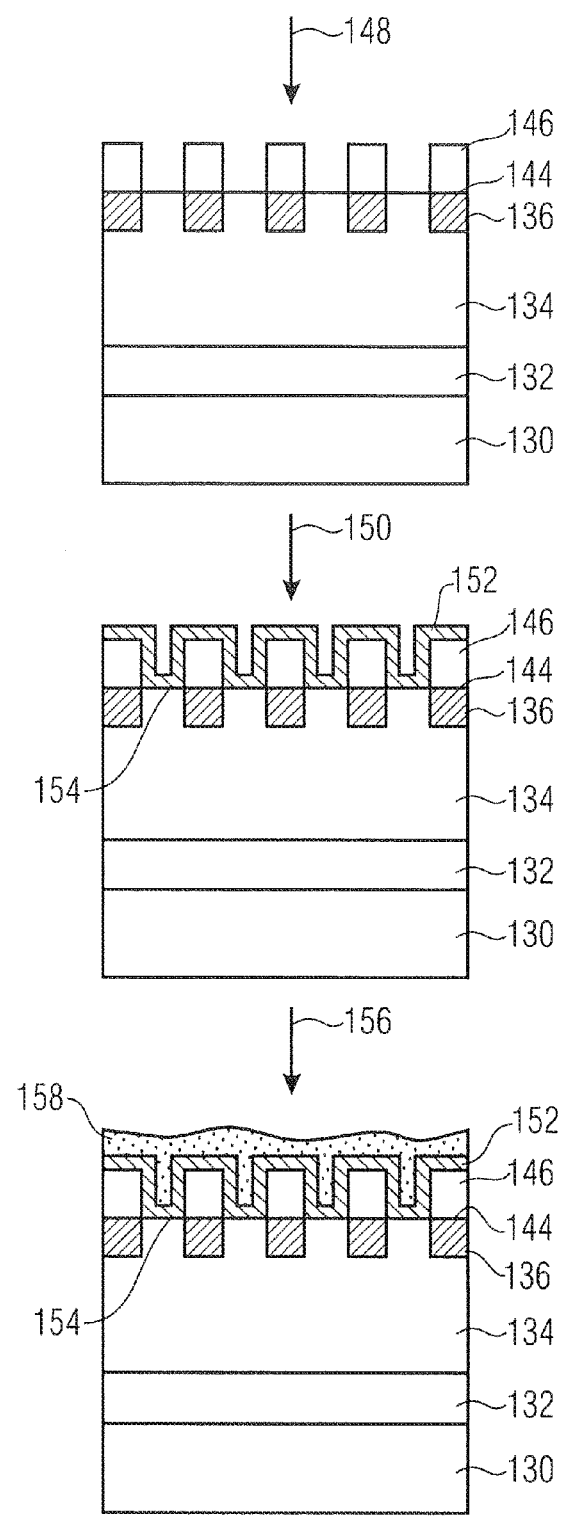
FIG. 13*b* is a second sequence of schematized cross-sections of an SiC diode during the inventive manufacturing method.

FIG. 13 exemplarily depicts the manufacturing of a merged pn-Schottky SiC diode in a sequence of schematized cross-sections of an SiC substrate, pointing out the method of manufacturing a device by locally heating one or several metallization layers and by means.

A pre-processed wafer made of SiC 130 may comprise, for example, a field stop layer 132 and a lightly n$^-$-doped epitaxial layer 134. Highly doped p$^+$-areas 136 serving as emitters for the diode structure may be implanted within this epitaxial layer so that a cell structure of alternately highly doped p$^+$-regions 136 and lightly doped n$^-$regions 134 near the surface results. The p$^+$-regions may be fully annealed at high temperatures. Several suitable metallization layers, such as a first metallization layer of Ni 138 and a second metallization layer of Al 140, for example, may be deposited to the whole area. Co-vaporizing or sputtering the metallization layer on the basis of a mixed target which comprises both metals is also possible. The layer composition may be selected such that, for example, an intermetallic $AlNi_3$ phase may form. The overall layer thickness may be 20-200 nm, for example. However, it is also feasible for the metallization to consist of a ternary stack comprising, e.g., Ni/Al/Si, or of a ternary mixture comprising Ni,Al,Si.

Subsequently, the metallization layers may be made to react by locally irradiating the wafer with a laser pulse 142 of a suitable power and pulse duration, as has been described above. The areas to be irradiated are defined by a mask or a reticle which may be located within the laser-beam path. The mask or the reticle may be adjusted to the $p^+$-regions 136 already created in the wafer in such a manner that the metallization layers only react on the $p^+$-regions 136. In this context, the laser power and the pulse duration may be selected such that the SiC surface is included in the reaction. To this end, the surface temperature of the SiC should be heated up to temperatures higher than 950° C. If the metallization layers are selected in a suitable manner, an intermetallic reaction or an alloy formation, which may be include the surface substrate, will occur in the areas 146 irradiated by the laser. For example, $AlNi_3$ 146 may be formed from an Ni/Al stack. When using a ternary stack of Ni/Al/Si, a mixed crystal having the form of $Al_{(1-x)}NiSi_{(x)}$ may form. Subsequently, the non-irradiated metallization areas of the wafer may be removed, in an etching step 148, using one or several etching solvent. For example, Si, Ni and Al may be etched using an etching medium consisting of $H_2SO_4/HNO_3/HF/H_3PO_4$, whereas an intermetallic compound of Ni and Al is hardly attacked at all, since etching NiAl requires an electrochemical process. After the etching, the intermetallic compound 146 will thus be located on the $p^+$-regions 136, it being possible for a good ohmic contact 144 to form between these two areas due to the reaction. Once the surface has subsequently been cleaned, a Schottky metal, such as titanium 152, may be deposited onto the whole area. The titanium may then form, for example, a blocking contact 154 to the n-doped epitaxial layer. To reinforce the contact, e.g. aluminum may be applied as a contact reinforcing metal 158 in a further step 156. Thus, the SiC diode comprises an ohmic contact 144 between the $p^+$ region and the contact-reinforcing metals, whereas in the regions between the $p^+$ regions a blocking Schottky contact 154 to the n-doped epitaxial layer may form.

Figure 14:
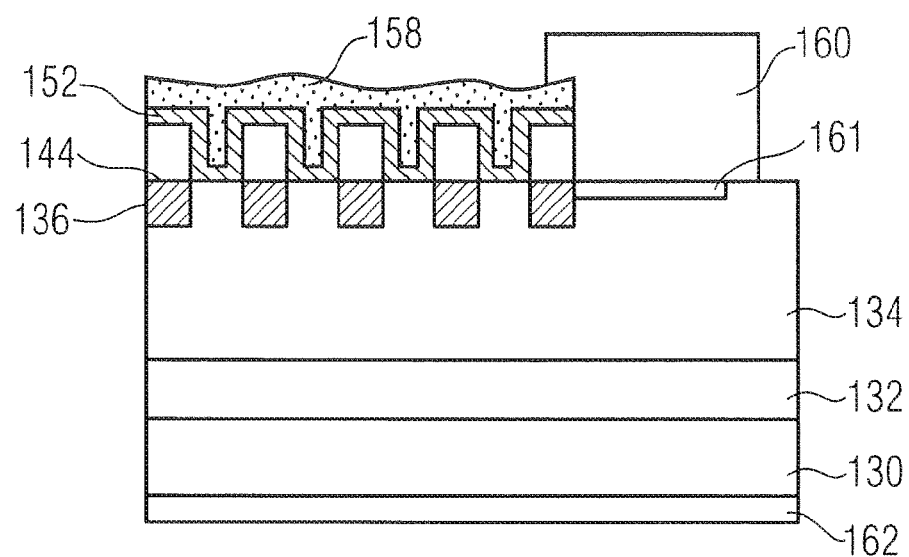
FIG. 14 is a schematized cross-section of a SiC diode.

FIG. 14 shows the schematic cross-section of an SiC diode as may be manufactured, for example, in accordance with the method. The diode comprises a substrate, for example of SiC 130 which may be adjacent a field stop zone 132, as well as a lightly $n^-$-doped epitaxial layer 134, it being possible for several implanted $p^+$-regions 136 to be located therein. The $p^+$-regions have the contact areas 144 located above them which have been manufactured by the method and which form a good ohmic behavior toward the overlying Schottky metal layer made of titanium 152 and an aluminum layer 158, for example. The SiC diode may also comprise an edge termination 161 and a passivation of polyimide 160, as well as a metallization layer 162 as a contact terminal on the rear side.

Figure 15:
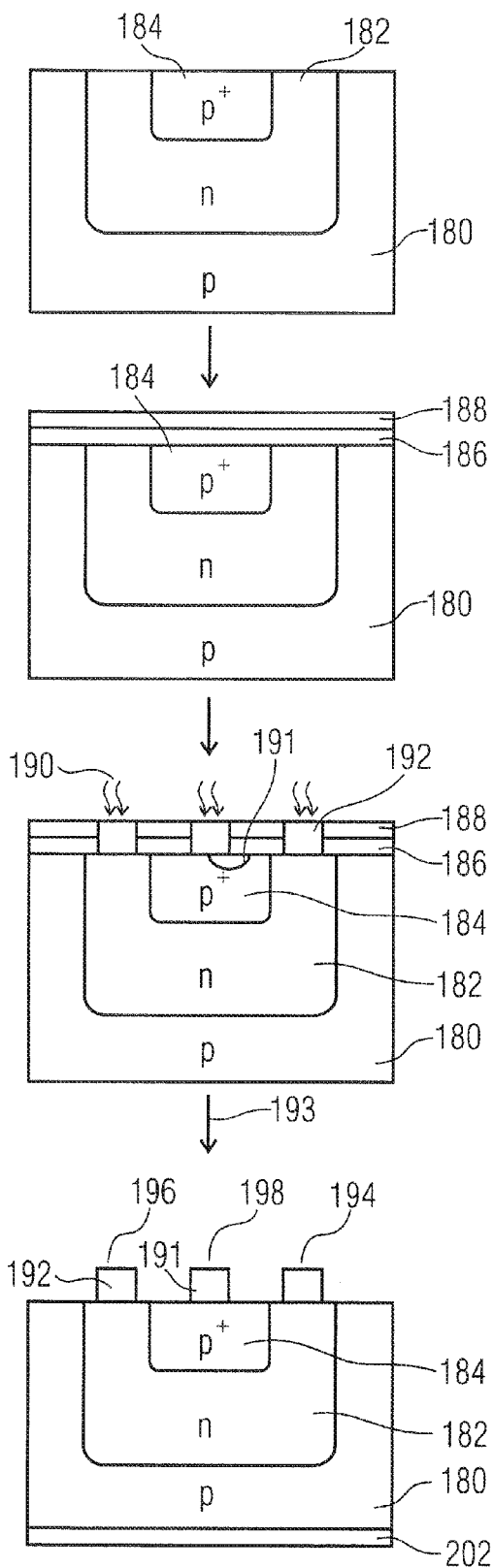
FIG. 15 is a sequence of schematized cross-sections of an SiC-JFET (JFET=junction-field-effect transistor) during the manufacturing method.

FIG. 15 shows a further embodiment of the method in terms of a sequence of schematized cross-sections for manufacturing, for example, an SiC-JFET. The SiC substrate comprises a p-doped area 180 having an n-doped area 182 implanted therein. This n-doped trough comprises further a highly $p^+$-doped region—the gate region. One or several metallization layers 186 and 188 may now be deposited to the whole area of this pre-processed substrate.

The metallization layers may be, e.g., a nickel layer and an aluminum layer. The one or several metallization layers may be used, among other things, as gate metallizations, and they may be deposited, in accordance with a later application, for example in a cascode circuit at a thickness of, e.g., 100 nm to 5 μm, since in the event of a breakdown of the JFET, the current will flow across the gate contact, and the contact should therefore be configured to be relatively thick. The SiC substrate is also contacted with this metallization, i.e. a suitable contact material which may be tempered at high temperatures should be used. Local irradiation using a laser pulse 190 of a suitable pulse duration and power may now again cause an intermetallic reaction or alloy formation 192 between the metallization layers 186 and 188 and the substrate surface, which may lead to the formation of a good ohmic contact 191. In a subsequent selective etching process 193, all non-irradiated areas may be removed from the metallization. Thus, the source contact 196 and the drain contact 194 may be formed on the n-doped region 182, as well as the gate contact 198 on the $p^+$-region 184. In further process steps, the rear-side gate terminal 202 and an insulating layer may be applied, for example.

Thus, a relatively thick gate metal contact with a low Ohmic contact may be formed by means of the method. Typically, the semiconductor is also contacted with this metallization, i.e. the contact metal used is one which may also be tempered at high temperatures in order to create a favorable contact behavior. The possible metals or alloys are mostly difficult to pattern, or cannot be patterned without residues, with wet-chemical etchings in combination with lithography steps. If the metallization is patterned in a lift-off process, defect density problems may occur at large thickness, e.g. larger than several 100 nm, the defect density problems arising due to the breaking of the metallization at the edges because of a continuous layer which is forming. With the inventive method, these problems should not arise.

Figure 16A:
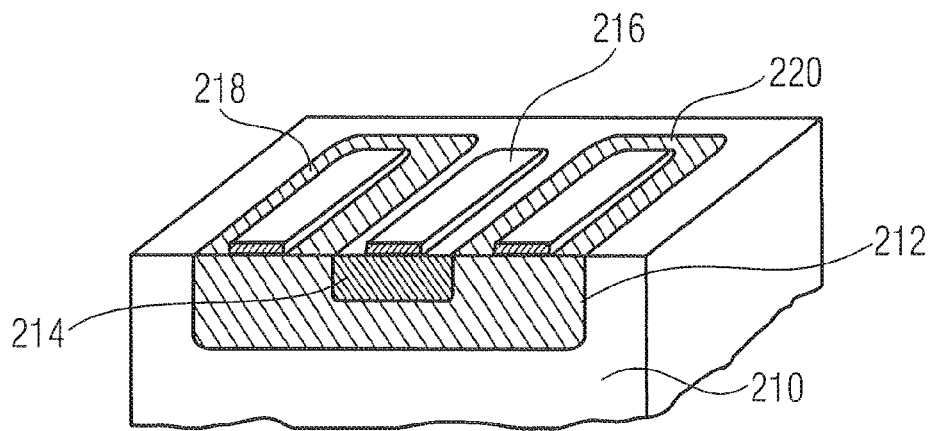
FIG. 16*a* is a schematized cross-section of a lateral SiC-JFET.

FIG. 16a shows the schematized cross-section of an SiC-JFET and the respective gate metallization contact as may be formed by the method.

The SiC-JFET comprises a p-doped region 210, an n-doped trough 212, and, implanted therein, a highly $p^+$-doped area 214, on which the gate contact 216 is located. The method may enable the gate contact to be configured to be relatively thick. The source contact 218 and the drain contact 220 may be located within the n-doped trough. Insulating layers, passivation layers and also a rear-side gate contact may be applied, for example, in further process steps.

Figure 16B:
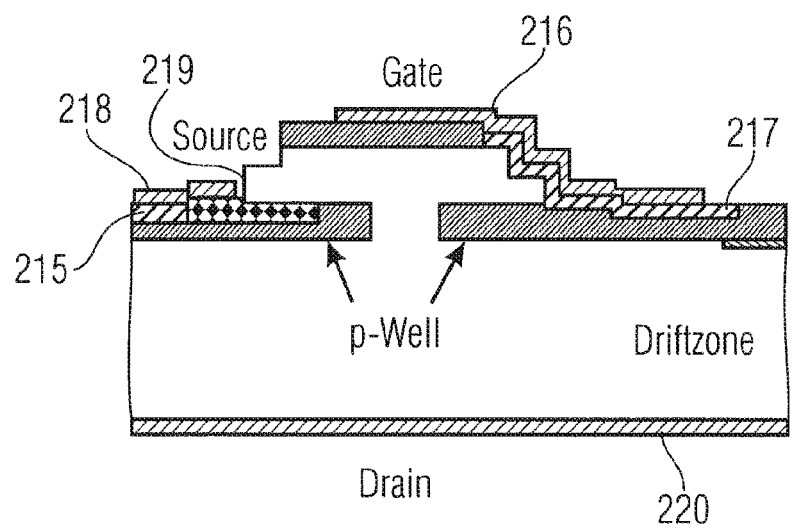
FIG. 16*b* is a schematized cross-section of a vertical SiC-JFET.

FIG. 16b is a schematized cross-section of a vertical SiC-JFET. In contrast to FIG. 16a, the drain contact is provided on the backside of the semiconductor portion representing the driftzone. For controlling current flow from the source contact 218 to the drain contact 20, a p-well in the n substrate is provided. Furthermore, the gate contact 216 is located on a p semiconductor portion, which terminates the n substrate. When a sufficient negative voltage is applied between gate and source, the region between the p well an the gate is fully depleted from carriers so that a current flow from the source contact to the drain contact is interrupted. The gate contact 216 in FIG. 16b can be manufactured in the same manner as the gate contact 216 in FIG. 16a using the method described herein.

The source contact is located on a highly doped n region for contacting the substrate between the p well and the p region, on which the gate contact is provided. The gate contact is separated from this n semiconductor region between the p well and the p portion below the gate contact by an insulator 217 such as an oxide. Similarly, the source contact is separated from the p well via an insulator such as an oxide 215.

Figure 17:
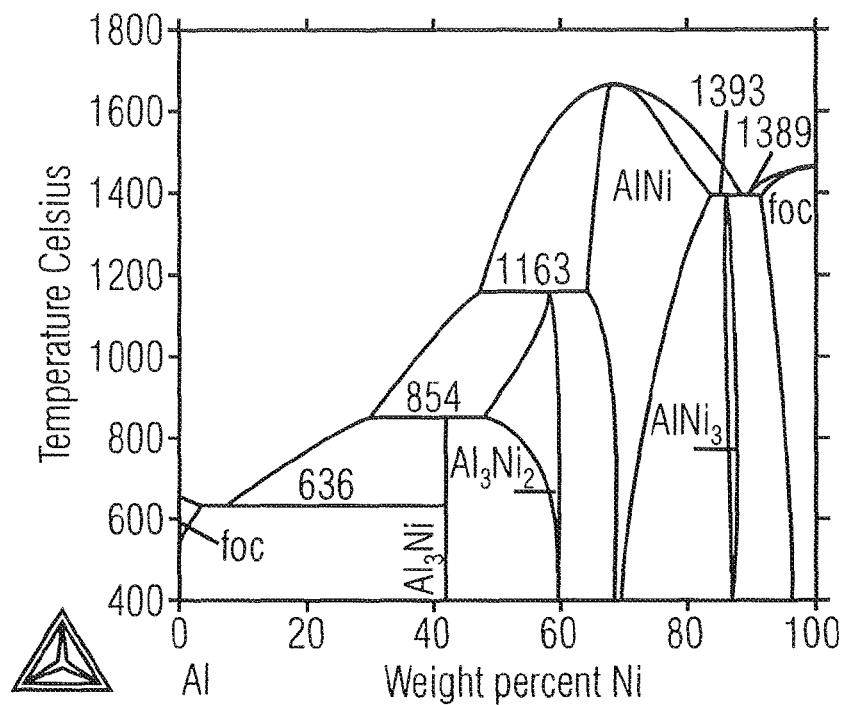
FIG. 17 is an AlNi phase diagram comprising a table of the Al—Ni structure data.

FIG. 17 shows the phase diagram of a nickel/aluminum system from which the layer composition at the respective temperature and the intermetallic phase forming therefrom may be derived, as well as a table containing the Al—Ni crystal structure data.

A number of potential metallic mixed compounds are available for depositing one or several metallization layers consisting of individual metal layers or on the basis of a mixed target. These may be binary systems, e.g. AlNi, AlSi, NiSi, or ternary systems, e.g. AlNiSi, NiFeSi or AlCoSi.

It is also feasible for the local heating of an area of the one or several metallization layers to be performed by means of a different apparatus. For example, by targeted irradiation using high-energy particles, such as electrons, local heating may be employed, which leads to the formation of an etch-selective compound in the one or several metallization layers.

Blocking Schottky contacts may also be formed, as a function of the materials used, in addition to the formation of low resistive Ohmic contacts in the areas of local heating between the metallization layers and the substrate.

By locally heating up an area of the one or several metallization layers, for example by means of a laser pulse and the temperature-depth profiles associated therewith, and by the subsequent selective etching, the metallization contacts thus formed may exhibit a soft cross-sectional curve than may be achieved with typical etching processes with conventional masks. Thus, the metallization contact may be formed such that the cross-section comprises a flat "bump-like" curve rather than sharp edges. Thus, the cross-section may comprise a lateral thickness curve which comprises a uniform and regular curve over its entire length. For locally heating up an area of the one or several metallization layers, use may also be made, in addition to laser pulses or series of laser pulses of the visible spectral range, of laser pulses or series of pulses of lasers emitting electromagnetic radiation in the infrared or ultraviolet regions. Local heating using electro-magnetic radiation may be performed, for example, within a spectral range of from 100 nm to 20 µm.

What is claimed is:

1. A device comprising:
  a substrate; and
  a metallization being locally arranged on a selected area of the substrate, the metallization comprising a metallization-layer compound, the metallization-layer compound being an alloy of at least two initial metals or an inter-metallic phase formed by different initial metals,
  wherein the initial metals are such that the initial metals exhibit etching selectivities towards an etching medium, the etching selectivities being different than an etching selectivity of the alloy or the inter-metallic phase, and
  wherein the metallization-layer compound is not provided on a further area of the substrate, the further area being adjacent to the selected area of the substrate.

2. The device as claimed in claim 1, wherein the substrate is a semiconductor substrate having n- and p-doped areas, wherein a first metallization is locally arranged on the p-doped areas, the first metallization comprising a good ohmic contact behavior toward the semiconductor substrate, wherein a second metallic layer is formed over an entire area of the first metallization and the n-doped areas, the second metallic layer forming, with the n-doped areas, a blocking Schottky contact, and wherein a further metallic layer is configured such that it fully or partly covers the second metallic layer and serves to improve the contact.

3. The device as claimed in claim 1, wherein the substrate is a semiconductor substrate comprising a trough having a first doping characteristic, which differs, in terms of its doping characteristic, from a second doping characteristic with which a semiconductor region surrounding the trough is doped, the device comprising a gate region within the trough, which is doped with the second doping characteristic, and comprising a metallization which has a source contact and a separate drain contact within the trough, and a separate gate contact within the gate region.

4. The device as claimed in claim 3, wherein an overall layer thickness of the metallization ranges between 10 nm and 20 µm.

5. The device as claimed in claim 1, wherein the metallization comprises a surface having a surface roughness less than a boundary roughness, the boundary roughness being less than or equal to a roughness which may be achieved by means of an etching process.

6. The device as claimed in claim 5, wherein the surface roughness is less than 0.5 nm rms.

7. A cascode circuit comprising a device comprising:
  a substrate; and
  a metallization being locally arranged on a selected area of the substrate, the metallization comprising a metallization-layer compound, the metallization-layer compound being an alloy of at least two initial metals or an inter-metallic phase formed by different initial metals,
  wherein the initial metals are such that the initial metals exhibit etching selectivities towards an etching medium, the etching selectivities being different than an etching selectivity of the alloy or the inter-metallic phase, and
  wherein the metallization-layer compound is not provided on a further area of the substrate, the further area being adjacent to the selected area of the substrate.

8. The cascode circuit as claimed in claim 7, wherein the substrate is a semiconductor substrate having n- and p-doped areas, wherein a first metallization is locally arranged on the p-doped areas, the first metallization comprising a good ohmic contact behavior toward the semiconductor substrate, wherein a second metallic layer is formed over an entire area of the first metallization and the n-doped areas, the second metallic layer forming, with the n-doped areas, a blocking Schottky contact, and wherein a further metallic layer is configured such that it fully or partly covers the second metallic layer and serves to improve the contact.

9. The cascode circuit as claimed in claim 7, wherein the substrate is a semiconductor substrate comprising a trough having a first doping characteristic, which differs, in terms of its doping characteristic, from a second doping characteristic with which a semiconductor region surrounding the trough is doped, the device comprising a gate region within the trough, which is doped with the second doping characteristic, and comprising a metallization which has a source contact and a separate drain contact within the trough, and a separate gate contact within the gate region.

10. The cascode circuit as claimed in claim 9, wherein an overall layer thickness of the metallization ranges between 10 nm and 20 µm.

11. The cascode circuit as claimed in claim 7, wherein the metallization comprises a surface having a surface roughness less than a boundary roughness, the boundary roughness being less than or equal to a roughness which may be achieved by means of an etching process.

12. The cascode circuit as claimed in claim 11, wherein the surface roughness is less than 0.5 nm rms.

* * * * *